(12) United States Patent
Gris

(10) Patent No.: US 6,989,310 B2
(45) Date of Patent: Jan. 24, 2006

(54) PROCESS AND INSTALLATION FOR DOPING AN ETCHED PATTERN OF RESISTIVE ELEMENTS

(75) Inventor: Yvon Gris, Tullins (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/689,528

(22) Filed: Oct. 20, 2003

(65) Prior Publication Data

US 2004/0115891 A1 Jun. 17, 2004

(30) Foreign Application Priority Data

Oct. 18, 2002 (FR) ................................ 02 13011

(51) Int. Cl.
*H01L 21/20* (2006.01)

(52) U.S. Cl. ........................... 438/382; 438/384

(58) Field of Classification Search ............ 438/382, 438/384, 385
See application file for complete search history.

(56) References Cited

U.S. PATENT DOCUMENTS 5,462,889 A * 10/1995 Tsukada et al. ............ 438/385

6,358,809 B1 3/2002 Nobinger et al. ........... 438/382

FOREIGN PATENT DOCUMENTS

EP 0167851 1/1986

OTHER PUBLICATIONS

Patent Abstracts of Japan, vol. 017, No. 475 (C-1103), Aug. 30, 1993 & JP 05117088A (Sumitomo Electric Ind. Ltd.), May 14, 1993.
Hutchings, Localized Semiconductor Diffusions Utilizing Local Laser Melting in Doping Atmospheres, Jan. 1974, IBM Technical Disclosure Bulletin, vol. 16, No. 8, Jan. 1, 1974, pp. 2585-2586, XP002246185.

* cited by examiner

*Primary Examiner*—Bradley K. Smith
(74) *Attorney, Agent, or Firm*—Lisa K. Jorgenson; Allen, Dyer, Doppelt, Milbrath & Gilchrist, P.A.

(57) ABSTRACT

A process for selectively doping predetermined resistive elements on an electronic chip is provided. The resistive elements are arranged in a pattern, and there are three phases in the process. The first phase electrically charges selected elements of the pattern. The second phase adds doping atoms to the charged elements as a function of their state of charge. The third phase anneals the electronic chip to cause penetration of the doping agents and to activate them.

17 Claims, 2 Drawing Sheets

PROCESS AND INSTALLATION FOR DOPING AN ETCHED PATTERN OF RESISTIVE ELEMENTS

FIELD OF THE INVENTION

The present invention relates to the field of microelectronics, and in particular, to a selective doping of an integrated circuit comprising a pattern of polycrystalline silicon deposited on oxide.

BACKGROUND OF THE INVENTION

For purposes of discussion, a pattern refers to a network of resistive elements on a substrate isolated from each other. The network includes pads, disks, rods and other types of resistive elements. An oxide layer is between the substrate and the network of resistive elements.

Polycrystalline silicon resistances are frequently formed in integrated circuits. The value of this resistance depends on the number of doping atoms added into the resistance during the integrated circuit fabrication process. One known method for locally inserting doping atoms is to perform a masking operation with photosensitive resin and introduce doping atoms by ionic implantation through the openings in the resin. However, this is a collective operation in the sense that all chips in a particular wafer and all wafers in a particular batch are made identical.

For some applications, it is useful to differentiate wafers from each other, or even chips from each other. For example, there may be a requirement to enter a specific reference, or more generally, there may be a requirement to write a specific program in a read only memory (ROM) of a single chip. A different photolithography mask can be made for each different inscription. The limit of this method is quickly reached due to the prohibitive cost of the different masks.

The method commonly used to perform these specific operations is to write directly onto a wafer using an electron beam. In other words, the resin is sensitive to electrons provided by an electron beam. The mask used becomes a virtual mask since it is written in the form of a program in an isolation machine. It is known that the wafer treatment rate of this type of isolation equipment using electron beams is low. Not only is it necessary to precisely describe the boundary of an element of the pattern to be created, which requires a very narrow beam, but the surface of every element of the pattern to be isolated has to be scanned, which would require a beam with a wider area to advance quickly.

Electron isolation machines are also very complex because the electron beam has to be positioned very precisely since the elements have small patterns, e.g., dimensions less than 0.1 $\mu$m. Electron isolation machines require large computer resources. The entire mask to be drawn has to be described in the form of a computer program.

Furthermore, the electron beam isolation method provides the resin surface with electrostatic loads that can deviate the electron beam. Thus, the shape of one element of a pattern creates electrostatic effects that influence the shape of the adjacent elements in the pattern. These proximity effects significantly complicate the write program used by the electron isolation machine that has to correct them. Furthermore, these proximity effects limit the minimum possible dimensions of the patterns.

SUMMARY OF THE INVENTION

In view of the foregoing background, one purpose of the invention is to provide a doping process and corresponding installation (or manufacturing) equipment for selectively programming certain elements of a pattern on certain chips on the same wafer without using a specific mask and without using an electron beam isolation machine.

Another purpose of the invention is to provide a doping process and manufacturing equipment that requires equipment in which the mechanical, electronic and programming characteristics are simpler as compared to equipment used for directly writing on a wafer by an electron beam.

Another purpose of the invention is to provide a doping method and manufacturing equipment that does not have any effect on the minimum dimensions of a pattern element to be doped.

Thus, according to a first aspect of the invention, a process for doping a pattern of electrically isolated resistive elements comprises the steps of electrically and selectively charging the elements of the pattern, adding doping atoms to the elements as a function of their charge, and rebaking the pattern.

The electrical charge may be provided by an electron beam or an ion beam. The electrical charging step of the resistive elements may comprise charging the entire pattern and then selectively discharge certain elements by a laser beam.

The step of adding doping atoms may comprise adsorbing ions on the surface of the charged elements. The ions may be produced by plasma and may be composed of ions derived from atoms chosen from among boron, aluminum, indium, phosphorus, arsenic and antimony.

The step of providing doping atoms may comprise implanting ions on the surface of uncharged elements with an energy of less than 100 eV. For example, the implanted ions may be derived from atoms chosen from among boron, aluminum, indium, phosphorus, arsenic and antimony. Advantageously, the elements in the pattern to be doped may be made from semiconductor material, for example silicon, germanium or gallium arsenide.

According to another aspect of the invention, a process for manufacturing an integrated circuit in a silicon substrate comprises depositing an isolating layer on the substrate, depositing a silicon layer on the isolating layer, and etching a pattern of resistive elements in the silicon layer. The process may further comprise selectively adding an electric charge on the predetermined elements, and doping the elements as a function of their charge. The elements of the pattern to be selectively doped may be separated by conducting lines connected to a fixed potential during the phase in which an electrical charge is selectively added to the patterns.

According to yet another aspect of the invention, installation equipment or an apparatus for selectively doping a pattern of electrically isolated resistive elements is provided. The apparatus may comprise three chambers accessible through a single lock. The first chamber may comprise means for selectively charging one or more selected elements of the pattern. The second chamber may comprise means for doping elements as a function of their charge, and the third chamber may comprise annealing means.

The first chamber may comprise means for generating an electron beam and focusing it at a precise location on a wafer. The second chamber may comprise means for generating a plasma of doping ions that can reach a wafer placed nearby. The third chamber may comprise means for per-forming a fast anneal of the wafer. The apparatus may comprise secondary locks, wherein the single lock distributes wafers in the three chambers through the secondary locks.

BRIEF DESCRIPTION OF THE DRAWINGS

The above purposes, characteristics and advantages of this invention, and others, will be described in further detail in the following description of particular embodiments, made in a non-limiting manner with respect to the appended figures, wherein.

DETAILED DESCRIPTION OF THE PREFERRED EMBODIMENTS

The various sectional views in the figures are not drawn to scale. A first embodiment of a method of manufacturing an integrated circuit according to the invention will first be described with reference to FIG. 1.

The initial substrate for example may be a monocrystalline silicon substrate 1 in which electronic components have been formed using techniques that are readily known by those skilled in the art. In subsequent steps of the integrated circuit fabrication process, these components will be electrically connected through metal interconnection levels made within an electrical insulator.

Before carrying out these steps in the fabrication of metal interconnections, a dielectric insulator 2, such as 400 nm of silicon oxide for example, is deposited over the entire wafer. This layer may be much thinner, such as 10 nm for example, or much thicker, such as 2 $\mu$m for example.

Polycrystalline silicon is then deposited. Preferably, the polycrystalline silicon will be very slightly doped so that its resistance is more than 10 mega-ohms per unit area. This resistance is adjusted by conventional means, for example by ionic implantation. The thickness of the silicon layer is preferably between 20 and 600 nm, and it is preferably 200 nm.

Figure 1:
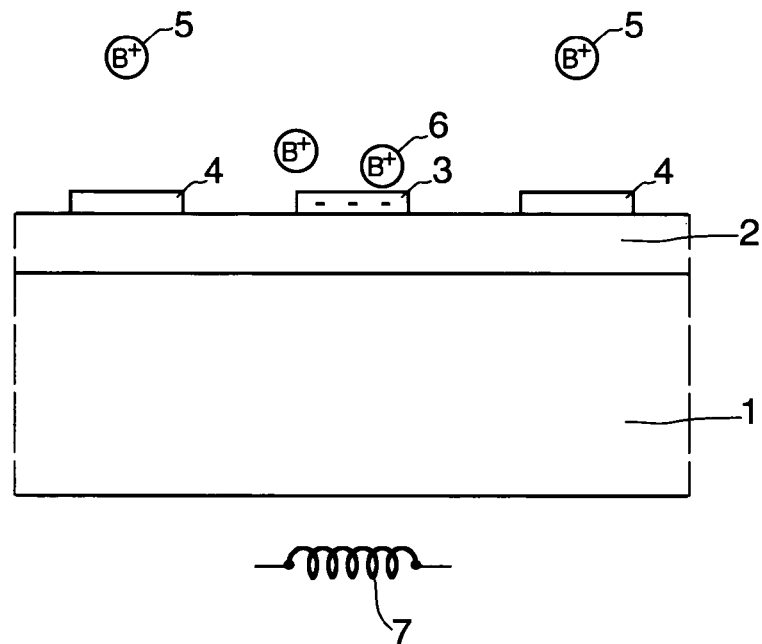
FIG. 1 is a sectional view of an integrated circuit according to the present invention.

The silicon layer is etched to form a pattern of resistive elements. This pattern may be formed from silicon rods that will create a resistance function. FIG. 1 diagrammatically shows a section through the wafer. A resistive element made of silicon 3 is shown, with two other resistive elements 4 adjacent to it on each side. Minimum dimensions are defined based upon the technology used to make the integrated circuit. The silicon elements 3, 4 are then fully isolated electrically from each other and from the substrate during this step.

An electron beam is used to add a negative electrical charge on predetermined elements of the pattern, such as the element denoted by reference numeral 3 in FIG. 1. Observation equipment using scanning electron microscopy exists for observing silicon wafers and can be used for implementing this step.

This equipment uses very low intensity electron beams (less than 10 pA) to avoid adding any electrical charge to the observed surfaces. All that is necessary to selectively charge a pattern element 3 is to program the electron beam so that it is automatically positioned above the element.

The intensity of the electron beam current is then increased to charge the element negatively. For example, a resistive element with a surface area of 0.2×2 $\mu$m separated from a conducting substrate by a 200 nm thick oxide has a capacitive value on the order of $0.7 \times 10^{-16}$ F with respect to the substrate. A 7 nA electron current for 1 $\mu$s is sufficient to bring the potential of this element to −100 V relative to the substrate. This value is determined from the basic equation I=CV/t where I, C, V and t respectively represent the current in a capacitance, the value of the capacitance, the voltage at the terminals of the capacitance, and the time during which the current is conducting. The potential is uniform over the entire selected resistive element 3 since the deposited silicon has been made slightly conducting.

The wafer containing the elements 3 that are negatively charged is placed close to or inside a plasma of ionized boron atoms 5. This type of plasma may be obtained by placing a gas such as $B_2F_6$ (boron hexafluoride) in an electric field with a frequency of a few giga-hertz. Under the effect of the electrostatic forces, positively charged boron ions (B+) denoted by reference 6 will be adsorbed on the surface of the elements 3. This adsorption is uniform since the deposited silicon is at a uniform potential. Aluminum or indium (Al+, In+) ions may be used instead of boron ions.

The adsorbed boron atoms are made to penetrate inside the silicon elements 3 by heating the wafer, for example using a fast annealing system. Halogen lamps 7 can increase the temperature of the substrate to about 1000° C. for 1 s, for this purpose. The P-type elements 3 thus doped will become more conducting. The resistance per unit area of these elements 3 is on the order of 100 ohms. Any other annealing type, for example annealing in a furnace, can be used.

Note that selection of some elements 3 of some chips in the wafer is made during the step in which the pattern 3 is electrically charged. The equipment used to perform this step does not need to be very precise, since all that is necessary is that the position of the elements be in memory (and not their shape as in the case for writing by an electron beam as described above). Moreover, the displacements only need to be sufficiently precise to position the electron beam above the selected elements, without any additional precision. Finally, the write time for each pattern is particularly short since the electron beam current can be increased.

The −100 V potential chosen in this example is high. This is the result of a compromise between several parameters. These parameters include the following: the required retention time for this potential decreases with time due to current leaks inherent to any charged element placed on a surface; the behavior of the subjacent oxide under voltage; the proximity of other elements 4 that are not to be disturbed by the electric field surrounding the element 3 during the adsorption step; and the quantity of doping agent to be adsorbed.

The potential of a resistive element 3 is typically greater than 5 volts and less than 500 volts. The end of the wafer fabrication process is conventional. An insulator, for example an oxide, is deposited. Photolithography operations can be used to etch contact holes and to make metal interconnection levels between the different electronic components in the integrated circuit and the elements 3 and 4.

There are many variations or embodiments of this invention. Thus, as was described in the first embodiment, the doping method comprises three distinct phases: a first phase in which an electrically isolated element is charged; a second phase in which a doping species is added; and a third phase which is annealing. Different embodiments are possible for each of these phases.

The design of microelectronics equipment dedicated to implementing the invention improves the fabrication quality of this invention. The time elapsed between the first and third phases described above must be as short as possible to keep the potential of the elements 3 constant at the beginning of the second phase, and a repetitive population of adsorbed ions at the beginning of the third phase.

Figure 2:
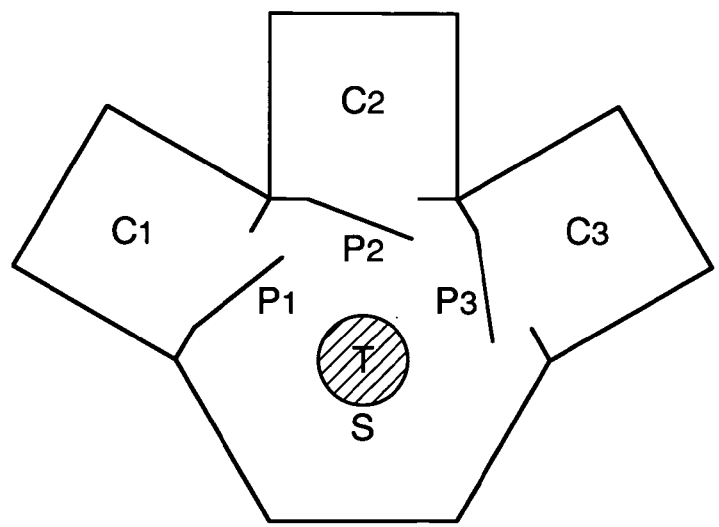
FIG. 2 is a block diagram of an installation area used to program the circuit shown in FIG. 1.

The equipment used for optimum implementation of the invention will now be described with reference to FIG. 2. This clean room equipment comprises three chambers C1, C2 and C3 connected to a common lock S through secondary locks P1, P2 and P3.

The chamber C1 is dedicated to the first phase and comprises means or equipment for charging the elements 3 with an electron beam. The secondary lock P1 maintains an optimum vacuum in the chamber C1.

The chamber C2 is dedicated to the second phase and generates an ion plasma that can be used to dope the elements 3. The secondary lock P2 prevents pollution of the main lock S by chemical species generated in the containment of C2.

The chamber C3 comprises means or equipment for annealing the wafer to do the third phase of the doping process. The annealing may a rapid thermal process (RTP) for example. The secondary lock P3 is used to keep the gaseous environment, for example argon, at the required pressure in the chamber C3.

The main lock S comprises means or equipment for quickly moving a wafer T from one chamber to the other. The lock system P1, P2 and P3 minimizes the transit times between the main lock S and the various chambers C1, C2, C3. The main lock S also comprises means or equipment for managing a complete batch of 25 wafers if necessary.

Figure 3:
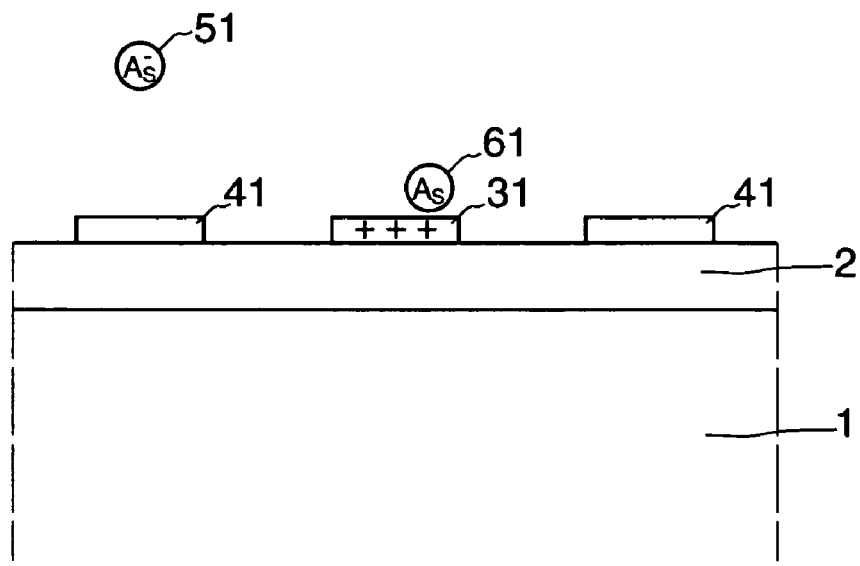
FIG. 3 is a sectional view of a circuit illustrating another embodiment of a process according to the present invention.

FIG. 3 illustrates a second embodiment of this invention. During the first phase, the selected resistive elements 31 are charged to a positive potential, for example with a positively charged ion beam.

During the second phase, the wafer is placed in a plasma of negatively charged ions 51. These ions may be phosphorus, arsenic or antimony (P—, As—, Sb—) ions. These ions are adsorbed on the surface of the positively charged elements.

During the third phase, the wafer is annealed. The resistivity of the programmed elements 31 reduces very sharply. The doping of these elements 31 is of the N-type.

Figure 4:
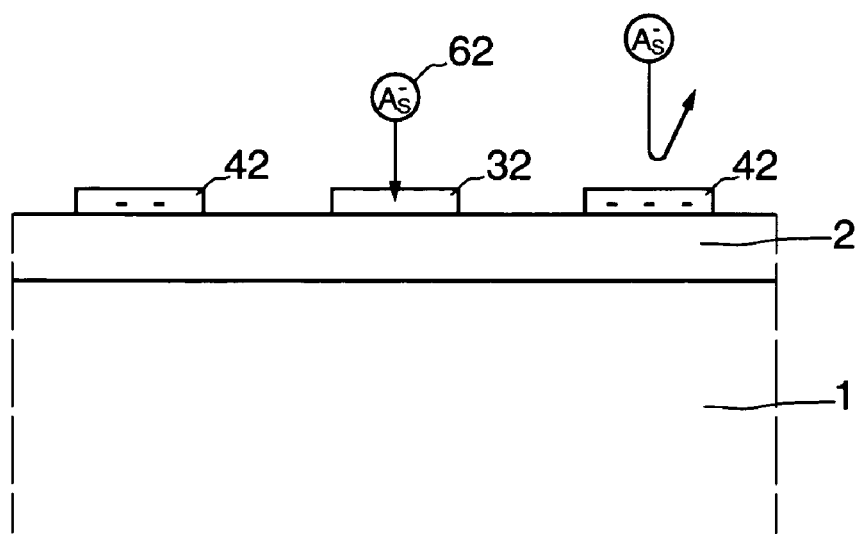
FIG. 4 illustrates a third embodiment of a process according to the present invention.

FIG. 4 illustrates a third embodiment of the invention. During the first phase, the etched elements made of polycrystalline silicon, such as the elements denoted by the general numeric reference 42, are negatively charged using the electron beam described above. During the second phase, an ionic implantation of the wafer is made with an ion beam 62 composed of negatively charged arsenic ions accelerated with a low energy of less than 100 eV, such as 50 eV for example.

The kinetic energy of these arsenic atoms is sufficiently low so that they are pushed by the electrostatic force due to the charge of the same sign of elements 42. The only implanted elements are the elements 32 that are not charged.

During the third phase, the wafer is annealed so as to obtain a low resistivity for the implanted elements 32. Variations of this third embodiment of the invention are possible. Thus, if the elements are negatively charged, every low energy negative like ions obtained from arsenic, phosphorus or antimony (As—, P—, Sb—) atoms (P—, As—, Sb—) will implant the complementary elements. If the pattern is positively charged, an implantation of positively charged doping ions obtained from boron, aluminum or indium atoms (B+, Al+, In+) will have to be used.

We will now describe a fourth embodiment of the invention. During the first phase, the entire surface of the wafer is negatively charged. This is done by scanning the entire surface with an electron beam, or more simply the surface is charged using an electrostatic comb brought to a strong negative potential. The wafer can also be placed in a strong electric field.

Thus, at this stage of the first phase, the surface of the wafer and the etched silicon elements comprise a large number of negative charges. A strong illumination of the surface, for example caused by a coherent laser type light beam focused on the surface, can make the surface locally conducting.

A laser beam is used to selectively discharge some selected elements, wherein the other silicon elements remain at a strong negative potential. The situation is then similar to that in the previous embodiments.

It is also possible to add a positive charge onto the surface and locally eliminate the positive charges by a laser illumination. This type of laser equipment based on microelectronics technology and capable of drawing a pattern in the resin is available for making masks that can be used in microelectronics technology. The problems caused by the laser beam write equipment, and the corresponding approach provided by the present invention, are equivalent to directly writing to a wafer using an electron beam according to the first embodiment.

The invention may be used with many variations and improvements as readily appreciated by those skilled in the art. In particular, elements in the pattern may be aligned on the network to facilitate integration in a ROM memory plane. Each 0 or 1 information in the memory plane is represented by a conducting or non-conducting element in the pattern. A person skilled in the art will be familiar with architectures and decoders used to read such a memory plane.

Each of the elements 3 and 4 may be surrounded by a grounded conducting track, for example in embodiment 1, to increase the precision latitude in positioning the electron beam during the first phase and to prevent any mutual electrostatic effect between elements 3 and 4 during the second phase.

Any type of semiconducting material can be used for the elements to be doped, and particularly amorphous or monocrystalline silicon, or germanium. It is also possible to use semiconducting compounds, for example gallium arsenide (AsGa). The ions used may be ionic complexes comprising several atoms and/or having several electrical charges.

The method is applicable starting from the moment at which the conductivity of the deposited isolated material can be modified by an electrically charged atom. The method is particularly applicable to devices of the SOI (silicon on insulator) type. For example, these electronic components are MOS transistors with a polycrystalline silicon gate.

According to the information provided by the invention, it is possible to selectively dope some transistors with an N-type doping agent applied on the source, drain and gate, and to dope other transistors with a P-type doping applied on the source, drain and gate. The result is to selectively obtain N channel transistors and P channel transistors on an insulator.

The first and second phases of the various embodiments may be combined during the same process to make elements with various doping types and properties. The use of microelectronics manufacturing techniques makes it possible to make elements 3 and 4 from materials for which the physical, magnetic and optical properties change depending on the ions added to the surface of the materials.

That which is claimed is:

1. A process for doping a pattern of electrically isolated resistive elements comprising:
   electrically charging selected elements of the pattern;
   doping the selected elements as a function of their charge after electrically charging the selected elements; and
   annealing the pattern.

2. A process according to claim 1, wherein the electrically charging is performed using at least one of an electron beam and an ion beam.

3. A process according to claim 1, wherein the electrically charging comprises:
   electrically charging all of the elements of the pattern; and
   discharging elements other than those corresponding to the selected elements using a laser beam.

4. A process according to claim 1, wherein the doping results in ions being absorbed on a surface of the charged elements.

5. A process according to claim 4, wherein the ions are produced using plasma; and wherein the ions comprise at least one of boron, aluminium, indium, phosphorus, arsenic and antimony.

6. A process according to claim 1, wherein the doping comprises implanting ions on a surface of uncharged elements with an energy of less than 100 eV.

7. A process according to claim 6, wherein the implanted ions comprise at least one of boron, aluminium, indium, phosphorus, arsenic and antimony.

8. A process according to claim 1, wherein the selected elements of the pattern comprise a semiconductor material.

9. A process according to claim 8, wherein the semiconductor material comprises at least one of silicon, germanium and gallium arsenide.

10. A process for manufacturing an integrated circuit in a silicon substrate comprising:
    forming an insulating layer on the silicon substrate;
    forming a silicon layer on the insulating layer;
    forming a pattern of resistive elements in the silicon layer;
    electrically charging selected elements; and
    doping the selected elements as a function of their charge after electrically charging the selected elements.

11. A process according to claim 10, wherein the elements that are charged are separated by conducting lines connected to a fixed potential.

12. A process according to claim 10, wherein the electrical charging is performed using at least one of an electron beam and an ion beam.

13. A process according to claim 10, wherein the electrical charging comprises:
    electrically charging all of the elements of the pattern; and
    discharging elements other than those corresponding to the selected elements using a laser beam.

14. A process according to claim 10, wherein the doping results in ions being absorbed on a surface of the charged elements.

15. A process according to claim 14, wherein the ions are produced using plasma; and wherein the ions comprise at least one of boron, aluminium, indium, phosphorus, arsenic and antimony.

16. A process according to claim 10, wherein the doping comprises implanting ions on a surface of uncharged elements with an energy of less than 100 eV.

17. A process according to claim 16, wherein the implanted ions comprise at least one of boron, aluminium, indium, phosphorus, arsenic and antimony.

* * * * *

UNITED STATES PATENT AND TRADEMARK OFFICE
CERTIFICATE OF CORRECTION

PATENT NO. : 6,989,310 B2  
APPLICATION NO. : 10/689528  
DATED : January 24, 2006  
INVENTOR(S) : Yvon Gris Page 1 of 1

It is certified that error appears in the above-identified patent and that said Letters Patent is hereby corrected as shown below:

Column 5, Line 27    Delete: "may a"
                     Insert: -- may be a --

Column 7, Line 32    Delete: "aluminium"
                     Insert: -- aluminum --

Column 8, Line 28    Delete: "aluminium"
                     Insert: -- aluminum --

Column 8, Line 35    Delete: "aluminium"
                     Insert: -- aluminum --

Signed and Sealed this

Twenty-ninth Day of August, 2006

JON W. DUDAS  
*Director of the United States Patent and Trademark Office*